(12) United States Patent
Hsu

(10) Patent No.: US 11,916,476 B2
(45) Date of Patent: Feb. 27, 2024

(54) VOLTAGE GENERATOR AND VOLTAGE GENERATING METHOD THEREOF

(71) Applicant: NANYA TECHNOLOGY CORPORATION, New Taipei (TW)

(72) Inventor: Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/741,465

(22) Filed: May 11, 2022

(65) Prior Publication Data
US 2023/0369970 A1  Nov. 16, 2023

(51) Int. Cl.
*H02M 3/07* (2006.01)
*H03K 19/20* (2006.01)

(52) U.S. Cl.
CPC .............. *H02M 3/07* (2013.01); *H03K 19/20* (2013.01)

(58) Field of Classification Search
CPC ................................ H02M 3/07; H03K 19/20
See application file for complete search history.

(56) References Cited

U.S. PATENT DOCUMENTS

| | | | |
|---|---|---|---|
| 6,765,428 B2 * | 7/2004 | Kim | H02M 3/073 327/535 |
| 6,774,708 B2 | 8/2004 | Matsui | |
| 9,356,506 B1 * | 5/2016 | Ho | H02M 3/07 |
| 2009/0191786 A1 * | 7/2009 | Pribbanow | A01M 31/004 446/202 |
| 2009/0322413 A1 * | 12/2009 | Huynh | H02M 3/073 327/536 |
| 2011/0133819 A1 * | 6/2011 | Cook | H02M 3/073 327/536 |

FOREIGN PATENT DOCUMENTS

| | | |
|---|---|---|
| CN | 102545591 | 7/2012 |
| CN | 105359049 | 2/2016 |
| CN | 110417256 | 11/2019 |
| TW | 201212500 | 3/2012 |

OTHER PUBLICATIONS

"Office Action of Taiwan Counterpart Application", dated May 3, 2023, p. 1-p. 3.

* cited by examiner

*Primary Examiner* — Sibin Chen
(74) *Attorney, Agent, or Firm* — JCIPRNET

(57) ABSTRACT

A voltage generator and a voltage generating method are provided. The voltage generator includes at least one first charge pump circuit, at least one second charge pump circuit, an oscillator, a passing circuit, and a voltage detector. The first charge pump circuit is configured to receive a clock signal to generate a first pump voltage. The second charge pump circuit is configured to receive the clock signal to generate a first pump voltage. The oscillator is configured to provide the clock signal. The passing circuit is configured to receive the clock signal, a power-on detection signal and an external command. The voltage detector is configured to receive an operation voltage, and generate the power-on detection signal by detecting the operation voltage. The passing circuit determines whether to transmit the clock signal to the second charge pump circuit or not to activate or deactivate the second charge pump circuit.

10 Claims, 3 Drawing Sheets

VOLTAGE GENERATOR AND VOLTAGE GENERATING METHOD THEREOF

BACKGROUND

Technical Field

The disclosure relates to a voltage generator and a voltage generating method; particularly, the disclosure relates to the voltage generator and the voltage generating method for reducing a power up current.

Description of Related Art

Charge pump circuit is often used for pumping up a lower voltage to generate a higher voltage. While an electronic device requires a plurality of different voltages, a plurality of charge pump circuits are used to generate the plurality of different voltages. The charge pump circuits are enabled at the time of the electronic device being powered up. However, damages to electronic components in the electronic device may be caused by the excessive peak current due to a huge amount of the charge pump circuits.

SUMMARY

The disclosure is directed to a voltage generator and a voltage generating method for reducing a power up current.

In the disclosure, the voltage generator includes at least one first charge pump circuit, at least one second charge pump circuit, an oscillator, a passing circuit, and a voltage detector. The first charge pump circuit is configured to receive a clock signal to generate a first pump voltage. The second charge pump circuit is configured to receive the clock signal to generate a first pump voltage. The oscillator is configured to provide the clock signal. The passing circuit is configured to receive the clock signal, a power-on detection signal and an external command. The voltage detector is configured to receive an operation voltage, and generate the power-on detection signal by detecting the operation voltage. The passing circuit determines whether to transmit the clock signal to the second charge pump circuit or not to activate or deactivate the second charge pump.

In the disclosure, the voltage generating method is adapted to a voltage generator comprising at least one first charge pump circuit, and at least one second charge pump circuit. The voltage generating method includes: receiving a clock signal, via the at least one first charge pump circuit, to generate a first pump voltage; and determining whether to transmit a clock signal to the at least one second charge pump circuit or not to activate or deactivate the at least one second charge pump circuit for receiving the clock signal to generate a first pump voltage.

Based on the above, according to the voltage generator and the voltage generating method of the disclosure, the second charge pump circuit remains deactivated until the passing circuit transmits the clock signal to the second charge pump circuit. Therefore, while the voltage generator or the voltage generating method is implemented in an electronic device, the peak currents induced by the first charge pump circuit and the second pump circuit are respectively generated at different time points, thereby preventing the damage to the electronic components due to excessive peak current.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
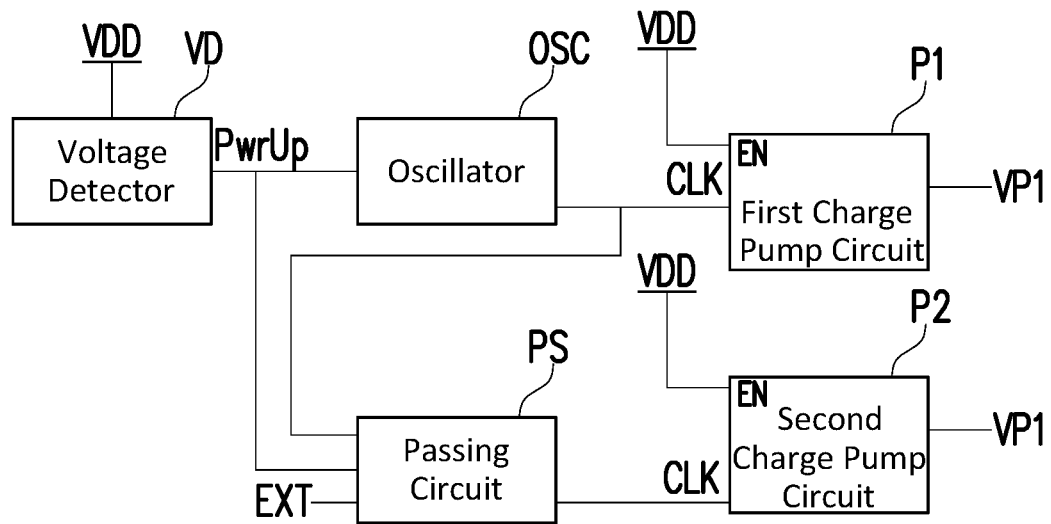
FIG. 1 is a schematic block diagram of a voltage generator according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

FIG. 1 is a schematic block diagram of a voltage generator according to an embodiment of the disclosure. With reference to FIG. 1, a voltage generator 100 may include at least one first charge pump circuit P1, at least one second charge pump circuit P2, an oscillator OSC, a passing circuit PS, and a voltage detector VD. The first charge pump circuit P1 is configured to receive a clock signal CLK to generate a first pump voltage VP1. The second charge pump circuit P2 is configured to receive the clock signal CLK to generate the first pump voltage VP1. The oscillator OSC is configured to provide the clock signal CLK. The passing circuit PS is configured to receive the clock signal CLK, a power-on detection signal PwrUp and an external command EXT. The voltage detector VD is configured to receive an operation voltage VDD, and generate the power-on detection signal PwrUp by detecting the operation voltage VDD.

It is noted that, the oscillator OSC may provide the clock signal CLK to activate the first charge pump circuit, and the passing circuit PS determines whether to transmit the clock signal CLK to the second charge pump circuit P2 or not to activate or deactivate the second charge pump circuit P2. That is, only the first charge pump circuit P1 is enabled according to the operation voltage VDD and activated to generate the first pump voltage VP1, and the second charge pump circuit P2 is activated to generate the first pump voltage VP1 according to the passing circuit PS. Therefore, while the voltage generator 100 is implemented in an electronic device, the peak current induced by the first charge pump circuit P1 and the second pump circuit P2 are respectively generated at different time points, thereby a damage to the electronic components of the electronic device due to excessive peak current can be prevented.

It should be noted here, the second charge pump circuit P2 can be activated later than an activation time point of the first charge pump circuit P1. In this embodiment, the passing circuit PS may pass the clock signal CLK to the second charge pump circuit P2 when the power-on detection signal PwrUp is enabled and the external command has been received.

In one embodiment, the first charge pump circuit P1 and the second charge pump circuit P2 may respectively include enable ends EN which are tied to the operation voltage VDD. To be specific, the enable ends EN of the first charge pump circuit P1 and the second charge pump circuit P2 may receive the operation voltage VDD.

During a power on sequence, when the operation voltage VDD is greater than a preset threshold voltage Vt, the voltage detector VD may enable the power-on detection signal PwrUp by comparing the operation voltage VDD with a preset threshold voltage Vt. Correspondingly, the oscillator OSC may provide the clock signal CLK to the first charge pump circuit P1 when the power-on detection signal PwrUp is enabled. Such as that, the first charge pump circuit P1 may pump up a first voltage V1 to generate the first pump voltage VP1 according to the clock signal CLK.

In one embodiment, the passing circuit PS may generate a control signal CTR according to the power-on detection signal PwrUp and the external command EXT, and transmit the clock signal to the second charge pump circuit P2 according to the control signal CTR. The passing circuit PS may latch enabling states of the external command EXT and the power-on detection signal PwrUp to generate the control signal CTR.

If the power-on detection signal PwrUp and the external command EXT are both enabled, the control signal CTR may be enabled, and the passing circuit PS may transit the clock signal CLK to the second charge pump circuit P2 to activate the second charge pump circuit P2. If at least one of the power-on detection signal PwrUp and the external command EXT is disabled, the passing circuit PS may block a transmission of the clock signal CLK to the second charge pump circuit P2 to dis-activate the second charge pump circuit P2. That is, the passing circuit PS may determine whether to transmit the clock signal CLK to the second charge pump circuit P2 or not according to the power-on detection signal PwrUp and the external command EXT.

It is worth mentioning that, the power-on detection signal PwrUp is enabled before an enable time point of the external command EXT. That is, the passing circuit PS may receive the external command EXT which is enabled after the power-on detection signal PwrUp being enabled.

In one embodiment, the external command EXT may be a non-operation (NOP) command, and the NOP command may be generated by an electronic device after the electronic device is powered up. Of course, in some embodiments, the external command EXT may be other specific command apart from the NOP command, and this disclosure is not limited thereto.

In one embodiment, the electronic device may be, for example, a memory device or other devices including electronic components, and this disclosure is not limited thereto.

In one embodiment, the oscillator OSC may be coupled between the voltage detector VD and the first charge pump circuit P1. The passing circuit PS may be coupled between the oscillator OSC and the second charge pump circuit P2.

In one embodiment, the first charge pump circuit P1 and the second charge pump circuit P2 may receive the first clock Clock1 to generate a same voltage (i.e., the first pump voltage VP1). In another embodiment, the first charge pump circuit P1 and the second charge pump circuit P2 may receive the first clock Clock1 to generate different voltages. That is, in some embodiments, one or more first charge pump circuits P1 for generating the first pump voltage VP1 may be activated at a first time point, and one or more second charge pump circuits P2 for generating the first pump voltage VP1 or the different voltage are activated at a second time point which is different from the first time point. Such as that, a total power up current of the voltage generator 100 can be divided into several parts which are occurred respectively at different time points. Damage to the electronic components of the electronic device due to excessive peak current can be prevented.

In this manner, the second charge pump circuit P2 may remain deactivated until the passing circuit PS transmits the clock signal CLK to the second charge pump circuit P2. Therefore, while the voltage generator 100 is implemented in an electronic device, the peak currents induced by the first charge pump circuit P1 and the second pump circuit P2 are respectively generated at different time points, thereby preventing the damage to the electronic components of the electronic device due to excessive peak current.

Figure 2:
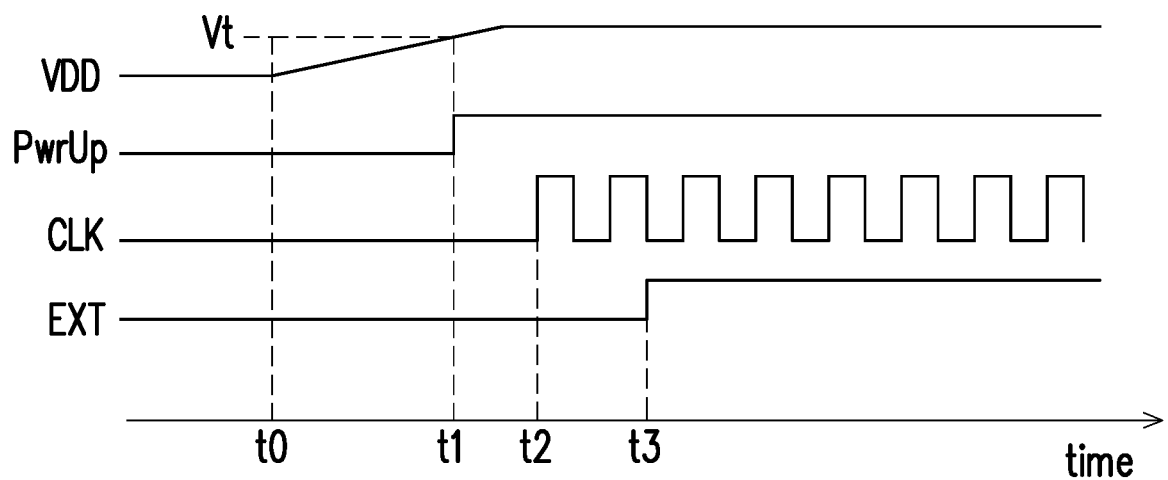
FIG. 2 is a schematic timing chart of a voltage generator according to an embodiment of the disclosure.

FIG. 2 is a schematic timing chart of a voltage generator according to an embodiment of the disclosure. With reference to FIG. 1 and FIG. 2, the timing chart 200 may include the operation voltage VDD, the power-on detection signal PwrUp, the clock signal CLK, and the external command EXT. To make the relationship between the operation voltage VDD, the power-on detection signal PwrUp, the clock signal CLK, and the external command EXT more comprehensible, the sequence of the operation voltage VDD, the power-on detection signal PwrUp, the clock signal CLK, and the external command EXT is described in detail as follows.

At a time point t0, during a power on sequence, the operation voltage VDD may start to be increased from a preset off voltage to a preset on voltage gradually. At a time point t1, the operation voltage VDD may be larger than a preset threshold voltage Vt. In response to the operation voltage VDD being greater than the preset threshold voltage Vt, the voltage detector VD may enable the power-on detection signal PwrUp. That is, the power-on detection signal PwrUp may be switched from a low logic level to a high logic level.

At a time point t2, in response to the power-on detection signal PwrUp, the oscillator OSC may provide the clock signal CLK to the first charge pump circuit P1, and the first charge pump circuit P1 is enabled by the operation voltage VDD and activated by the clock signal CLK to receive the clock signal CLK to generate the first pump voltage VP1. Especially, the first charge pump circuit P1 is activated, and the second charge pump circuit P2 remains deactivated between the time point t0 and a time point t3.

At the time point t3, the passing circuit PS may receive the enabled external command EXT with the high logic level. In response to the external command EXT and the power-on detection signal PwrUp being both enabled, the passing circuit PS may provide the control signal CTR which is enabled. In addition, according to the control signal CTR, the passing circuit PS may transmit the clock signal CLK to the second charge pump circuit P2, and the second charge pump circuit P2 is activated to receive the clock signal CLK to generate the first pump voltage VP1. That is, the second charge pump circuit P2 is activated after the first charge pump circuit P1 is activated.

In this manner, the second charge pump circuit P2 may remain deactivated until the time point t3. Therefore, while the voltage generator 100 is implemented in an electronic device, the peak currents induced by the first charge pump circuit P1 and the second pump circuit P2 are respectively generated at different time points, thereby preventing the damage to the electronic components of the electronic device due to excessive peak current.

It is noted that the high logic level and the low logic level of the signals, voltages, and commands are an exemplary embodiment, and the disclosure is not limited thereto.

Figure 3:
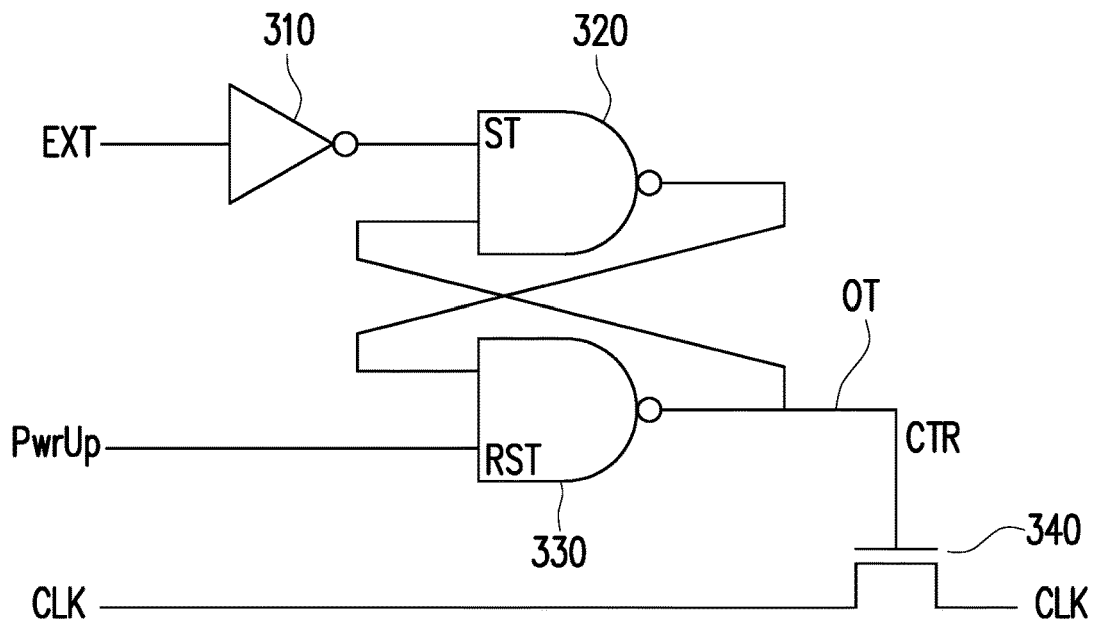
FIG. 3 is a schematic block diagram of a passing circuit according to an embodiment of the disclosure.

FIG. 3 is a schematic block diagram of a passing circuit according to an embodiment of the disclosure. With reference to FIG. 1 and FIG. 3, the passing circuit PS may be a SR-latch, and include a NOT gate 310, a NAND gate 320, a NAND gate 330 and a switch 340. The SR-latch may have a set end ST for receiving an inverted signal of the external command EXT, a reset end RST for receiving the power-on detection signal PwrUp, and an output end OT for generating the control signal CTR. The switch 340 may have a first end for receiving the clock signal CLK, a second end coupled to the second charge pump circuit P2, and a control end for receiving the control signal CTR.

When the external command is at the high logic level, the NOT gate may output a first output signal with the low logic level. The NAND gate 320 and the NAND gate 330 are cross-coupled to form a latch for retaining the first output signal of the NOT gate 310.

The NAND gate 320 and the NAND gate 330 may retain the low logic level of the output signal of the NAND gate 310. When the power-on detection signal PwrUp is also at the high logic level, The NAND gate 320 and the NAND gate 330 may output the control signal CTR with the high logic level. The switch 340 may be enabled by the control signal CTR and transmit the clock signal CLK to the second charge pump circuit P2.

In this embodiment, the signal latch SL is a NAND type SR latch, in another embodiment, the signal latch SL may be a NOR type SR latch, and this disclosure is not limited thereto.

Figure 4:
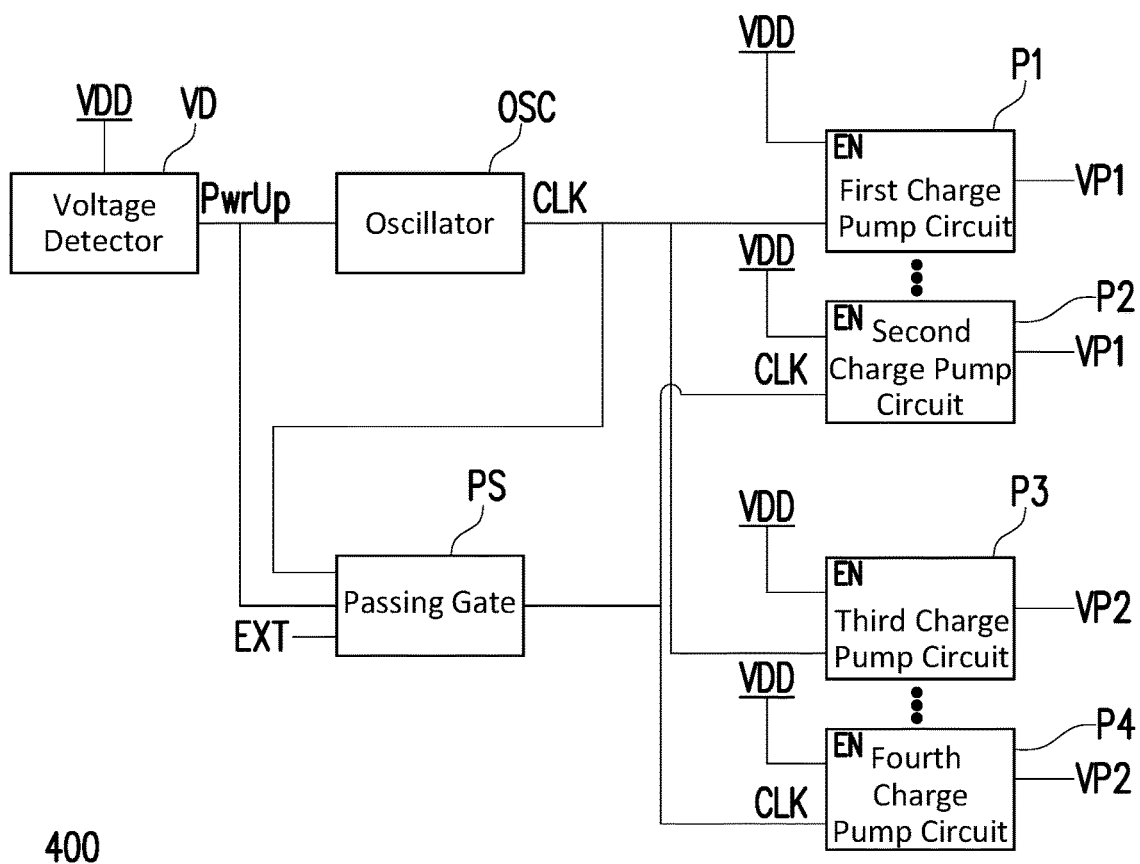
FIG. 4 is a schematic block diagram of a voltage generator according to an embodiment of the disclosure.

FIG. 4 is a schematic block diagram of a voltage generator according to an embodiment of the disclosure. With reference to FIG. 1 and FIG. 4, comparing to the voltage generator 100 of FIG. 1, a voltage generator 400 may further include at least one third charge pump circuit P3, and at least one fourth charge pump circuit P4. The details of the first charge pump circuit P1, the second charge pump circuit P2, the oscillator OSC, the passing circuit PS, and the voltage detector VD may refer to the description of FIG. 1, while the details are not redundantly described seriatim herein.

In one embodiment, the oscillator OSC may be coupled between the voltage detector VD and the third charge pump circuit P3. The passing circuit PS may be coupled between the oscillator OSC and the fourth charge pump circuit P4.

In one embodiment, the third charge pump circuit P3 may be configured to receive the clock signal CLK to generate a second pump voltage VP2. The fourth charge pump circuit P4 is configured to receive the clock signal CLK to generate the second pump voltage VP2. The passing circuit PS determines whether to transmit the clock signal CLK to the second charge pump circuit P4 or not to activate or deactivate the second charge pump circuit P4. That is, only the first charge pump circuit P1 is enabled according to the operation voltage VDD and activated to generate the second pump voltage VP3, and the second charge pump circuit P2 is activated to generate the second pump voltage VP2 according to the passing circuit PS. The detailed embodiments of the third charge pump circuit P3, and the fourth charge pump circuit P4 may refer to the first charge pump circuit P1, and the second charge pump circuit P2.

In one embodiment, the first pump voltage VP1 may be same as the second pump voltage VP2. That is, one or more charge pump circuits (e.g., first charge pump circuit P1 and third charge pump circuit P3) of all the charge pump circuits for generating a same voltage is are activated first, and one or more charge pump circuits (e.g., second charge pump circuit P2 and fourth charge pump circuit P4) of all the charge pump circuits for receiving the same voltage are activated later. In another embodiment, the first pump voltage VP1 may be different from the second pump voltage VP2. That is, one or more charge pump circuits (e.g., first charge pump circuit P1 and third charge pump circuit P3) of all the charge pump circuits for generating two different voltages are activated first, and one or more charge pump circuits (e.g., second charge pump circuit P2 and fourth charge pump circuit P4) of all the charge pump circuits for generating the two different voltages are activated later. In other words, this disclosure does not limit the first pump voltage VP1 and the second pump voltage VP2 being the same or different.

In this manner, the second charge pump circuit P2 and the fourth charge pump circuit P4 may remain deactivated until the passing circuit PS transmits the clock signal CLK to the second charge pump circuit P2 and the fourth charge pump circuit P4. Therefore, while the voltage generator 400 is implemented in an electronic device, the peak currents induced by the charge pump circuits are generated at different time points, thereby preventing the damage to the electronic components of the electronic device due to excessive peak current.

Figure 5:
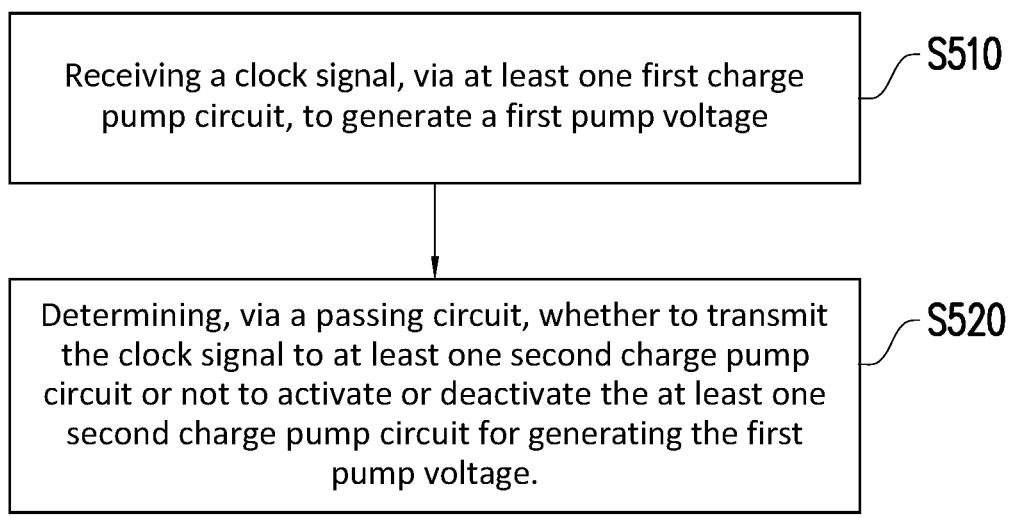
FIG. 5 is a schematic flow chart of a voltage generating method according to an embodiment of the disclosure.

FIG. 5 is a schematic flow chart of a voltage generating method according to an embodiment of the disclosure. With reference to FIG. 1 and FIG. 5, the voltage generating method 500 may be adapted to the voltage generator 100 or the voltage generator 400 including at least one first charge pump circuit P1 and at least one second charge pump circuit P2. In addition, the implementation details of the voltage generating method 500 may be referred to the descriptions of FIG. 1 to FIG. 4 to obtain sufficient teachings, suggestions, and implementation embodiments, while the details are not redundantly described seriatim herein.

In a step S510, the first charge pump circuit P1 is activated and configured to receive the clock signal CLK to generate the first pump voltage VP1.

In a step S520, the passing circuit determines whether to transmit the clock signal CLK to the second charge pump circuit P2 or not to activate or deactivate the second charge pump circuit P2 for generating the first pump voltage VP1.

Details of the steps S510 and S520 have been described in the embodiments mentioned above, and no more repeated description here.

Therefore, while the voltage generating method 500 is implemented in an electronic device, the peak currents induced by the first charge pump circuit P1 and the second pump circuit P2 are respectively generated at different time points, thereby preventing the damage to the electronic components of the electronic device due to excessive peak current.

In summary, according to the voltage generator and the voltage generating method of the disclosure, the second charge pump circuit remains deactivated until the passing circuit transmits the clock signal to the second charge pump circuit. Therefore, while the voltage generator or the voltage generating method is implemented in an electronic device, the peak currents induced by the first charge pump circuit and the second pump circuit are respectively generated at different time points, thereby preventing the damage to the electronic components due to excessive peak current.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A voltage generator, comprising:
   at least one first charge pump circuit, receiving a clock signal to generate a first pump voltage;
   at least one second charge pump circuit, receiving the clock signal to generate the first pump voltage;
   an oscillator, providing the clock signal;
   a passing circuit, receiving the clock signal, a power-on detection signal and an external command; and
   a voltage detector, receiving an operation voltage, and generating the power-on detection signal by detecting the operation voltage,
   wherein the passing circuit determines whether to transmit the clock signal to the at least one second charge pump circuit or not to activate or deactivate the at least one second charge pump circuit, wherein the passing circuit comprises:
   a SR-latch, having a set end for receiving an inverted signal of the external command, a reset end for receiving the power-on detection signal, and an output end for generating a control signal; and
   a switch, having a first end for receiving the clock signal, a second end coupled to the at least one second charge pump circuit, and a control end for receiving the control signal.

2. The voltage generator according to claim 1, wherein the passing circuit generates the control signal according to the power-on detection signal and the external command, and transmits the clock signal to the at least one second charge pump circuit according to the control signal.

3. The voltage generator according to claim 1, wherein if the power-on detection signal and the external command are enabled, the passing circuit transmits the clock signal to the at least one second charge pump circuit to activate the at least one second charge pump circuit.

4. The voltage generator according to claim 1, wherein if at least one of the power-on detection signal and the external command is disabled, the passing circuit blocks a transmission of the clock signal to the at least one second charge pump circuit a to de-activate the at least one second charge pump circuit.

5. The voltage generator according to claim 1, wherein the at least one first charge pump circuit pumps up a first voltage to generate the first pump voltage according to the clock signal.

6. The voltage generator according to claim 1, wherein the power-on detection signal is enabled before an enable time point of the external command.

7. The voltage generator according to claim 1, wherein the voltage detector enables the power-on detection signal when the operation voltage being greater than a threshold voltage.

8. The voltage generator according to claim 1, wherein enable ends of the at least one first charge pump circuit and the at least one second charge pump circuit receive the operation voltage.

9. The voltage generator according to claim 1, wherein the external command is a non-operation (NOP) command.

10. The voltage generator according to claim 1, further comprising:
    at least one third charge pump circuit, receiving the clock signal to generate a second pump voltage; and
    at least one fourth charge pump circuit, receiving the clock signal to generate a second pump voltage,
    wherein the at least one third charge pump circuit pumps up a second voltage to generate the second pump voltage according to the clock signal,
    the passing circuit determines whether to transmit the clock signal to the at least one fourth charge pump circuit or not to activate or deactivate the at least one fourth charge pump circuit.

* * * * *